(12) United States Patent
Tang et al.

(10) Patent No.: US 7,564,279 B2
(45) Date of Patent: Jul. 21, 2009

(54) POWER ON RESET CIRCUITRY IN ELECTRONIC SYSTEMS

(75) Inventors: Qiang Tang, Fremont, CA (US); Ramin Ghodsi, Cupertino, CA (US); Theodore T. Pekny, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/874,609

(22) Filed: Oct. 18, 2007

(65) Prior Publication Data

US 2009/0102522 A1    Apr. 23, 2009

(51) Int. Cl.
*H03L 7/00* (2006.01)
(52) U.S. Cl. ............. 327/143; 327/142; 327/198
(58) Field of Classification Search ........... 327/142, 327/143, 198
See application file for complete search history.

(56) References Cited

U.S. PATENT DOCUMENTS

| | | | |
|---|---|---|---|
| 5,563,504 A | 10/1996 | Gilbert et al. | |
| 6,078,201 A | 6/2000 | Crotty | |
| 6,229,352 B1 | 5/2001 | Chevallier et al. | |
| 6,407,622 B1 | 6/2002 | Opris | |
| 6,868,500 B1 | 3/2005 | Kutz et al. | |
| 6,882,203 B2 | 4/2005 | Miyagi | |
| 6,924,676 B2 | 8/2005 | Marotta | |
| 7,057,427 B2 * | 6/2006 | Wadhwa et al. | 327/143 |
| 7,089,133 B1 | 8/2006 | Williams et al. | |
| 7,142,024 B2 | 11/2006 | Youssef | |
| 7,145,372 B2 | 12/2006 | Tang et al. | |
| 7,193,907 B2 | 3/2007 | Nakatake et al. | |
| 7,199,623 B2 | 4/2007 | Kwon | |
| 7,248,085 B2 | 7/2007 | Jung | |
| 7,268,598 B2 * | 9/2007 | Zolfaghari | 327/143 |
| 2007/0046341 A1 * | 3/2007 | Tanzawa | 327/143 |

* cited by examiner

*Primary Examiner*—Kenneth B Wells
*Assistant Examiner*—John W Poos
(74) *Attorney, Agent, or Firm*—Brooks, Cameron & Huebsch, PLLC

(57) ABSTRACT

One or more embodiments of the present disclosure provide methods, devices, and systems for operating power on reset (POR) circuitry. One method embodiment includes providing a voltage to a POR circuit of the system, detecting when the voltage reaches a number of different trip levels, maintaining a count of the number of times an output signal of the POR circuit trips in response to a detected reaching of one of the number of different trip levels, and adjusting the trip level to be detected based at least partially on the count.

25 Claims, 7 Drawing Sheets

| Pulse Count | COUNTER STATE | | CNTout | |
|---|---|---|---|---|
| | Q | q | | |
| 0 | 0 | 0 | Pcnt 0 | 411-0 |
| 1 | 0 | 1 | Pcnt 1 | 411-1 |
| 2 | 1 | 0 | Pcnt 2 | 411-2 |
| 3 | 1 | 1 | Pcnt 3 | 411-3 |

POWER ON RESET CIRCUITRY IN ELECTRONIC SYSTEMS

BACKGROUND

Memory devices can be provided as internal, semiconductor, integrated circuits in computers or other electronic devices and systems. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices often use a one-transistor memory cell that allows for high memory densities, high reliability, and low power consumption. Uses for flash memory include memory for personal computers, personal digital assistants (PDAs), digital cameras, and cellular telephones, among others.

Power-on reset (POR) circuitry is often used in memory devices to insure proper functionality of the device when power is initially applied to the device, e.g., during power on of the device, and to insure proper functionality of the device if power to the device is temporarily lost. Power-on reset circuits can prevent various internal logic circuits of the device from functioning until after the power-on reset circuit determines that the applied supply voltage, e.g., Vcc, is adequate. In various instances, the applied supply voltage that is adequate to insure proper functioning of the internal circuit can vary depending on the type of logic circuit and/or the particular function of the circuit.

For example, internal logic circuits may include logical data latches whose output signal may be reset when the supply voltage reaches a first level, but whose output signal may not present an accurate value until the supply voltage reaches a different level, e.g., a higher level at which the output signal of the latches is accurate. Other examples of internal logic circuits of a device which a POR circuit may prevent from functioning until the POR circuit determines that the applied supply voltage is adequate can include, but are not limited to, reference voltage circuits and charge pump circuits.

DETAILED DESCRIPTION

One or more embodiments of the present disclosure provide methods, devices, and systems associated with operating power on reset (POR) circuitry. One method embodiment includes providing a voltage to a POR circuit of the system, detecting when the voltage reaches a number of different trip levels, maintaining a count of the number of times an output signal of the POR circuit trips in response to a detected reaching of one of the number of different trip levels, and adjusting the trip level to be detected based at least partially on the count.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1:
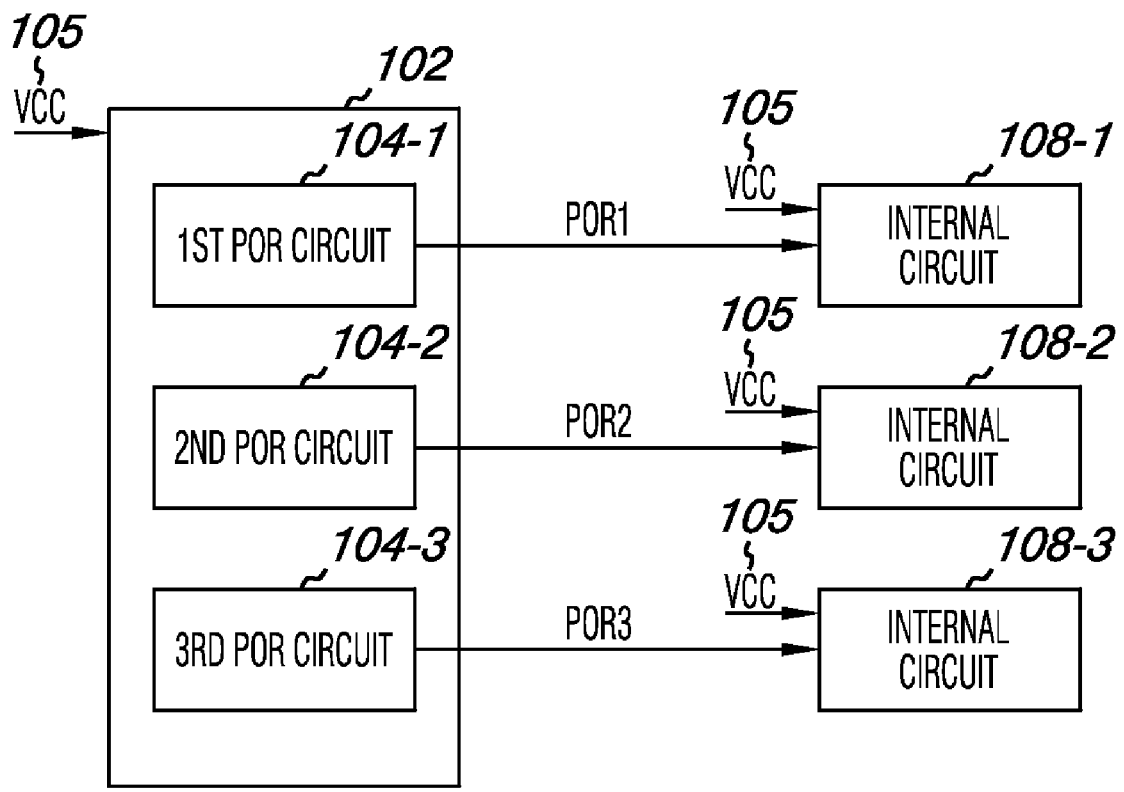
FIG. 1 illustrates an example of POR circuitry associated with providing POR signals according to a previous approach.

FIG. 1 illustrates an example of POR circuitry 102 associated with providing POR signals to internal circuitry of an electronic device according to a previous approach. In the example shown in FIG. 1, the POR circuitry 102 includes a number of different POR circuits 104-1, 104-2, and 104-3. Each POR circuit 104-1, 104-2, and 104-3 is used to detect when the applied power supply voltage VCC 105 reaches one particular voltage level. That is, each POR circuit 104-1, 104-2, and 104-3 includes one associated "trip level," e.g., one associated supply voltage level at which the particular POR circuit trips. As the reader will appreciate, and as illustrated in FIG. 2B, the applied power supply voltage, e.g., VCC 105, can ramp from an initial voltage, e.g., a ground voltage, to a substantially steady operating voltage level VCC during power on of an electronic device. In such cases, various internal circuits of the device may not function properly or accurately until the ramping supply voltage has reached an adequate voltage level, which may be different for the various internal circuits. For instance, some internal circuits may function properly when the applied supply voltage reaches a level of about 1.2V, while some other internal circuits of the system may not function properly until the applied supply voltage reaches a higher level, e.g., 1.4V, 1.5V, 2.0V, etc.

The example illustrated in FIG. 1 includes a number of internal circuits 108-1, 108-2, and 108-3. In this example, the supply voltage that is adequate to insure proper operation of the internal circuitry is different for each internal circuit 108-1, 108-2, and 108-3. As such, each internal circuit 108-1, 108-2, and 108-3 receives a separate POR signal when the supply voltage reaches the voltage level that is adequate for proper operation of the particular internal circuit 108-1, 108-2, and 108-3. In the example of FIG. 1, the different trip levels associated with the POR circuits 104-1, 104-2, and 104-3 correspond to the respective different supply voltage levels to insure proper operation of the respective internal circuits 108-1, 108-2, and 108-3.

As such, POR circuit 104-1 provides a first POR signal POR1 to internal circuit 108-1 when the POR circuit 104-1 trips, e.g., in response to POR circuit 104-1 detecting that the supply voltage has reached the voltage level sufficient to insure proper operation of internal circuit 108-1. Similarly, POR circuit 104-2 provides a second POR signal POR2 to internal circuit 108-2 when the POR circuit 104-2 trips, e.g., in response to POR circuit 104-2 detecting that the supply voltage has reached the voltage level sufficient to insure proper operation of internal circuit 108-2. POR circuit 104-3 provides a third POR signal POR3 to internal circuit 108-3 when the POR circuit 104-3 trips, e.g., in response to POR circuit 104-3 detecting that the supply voltage has reached the voltage level sufficient to insure proper operation of internal circuit 108-3.

However, providing electronic devices and systems having POR circuitry such as POR circuitry 102 illustrated in the example shown in FIG. 1 can have various drawbacks as compared to embodiments of the present disclosure. For instance, providing multiple POR signals, e.g., POR1, POR2, and POR3, from a number of separate POR circuits, e.g., 104-1, 104-2, and 104-3, can occupy significantly more area on an integrated circuit chip than embodiments of the present disclosure. For example, in one or more embodiments of the present disclosure, a single POR circuit, e.g., POR circuit 210 described below in FIG. 2A, can include an adjustable supply voltage trip level and can provide multiple POR signals in response to detection of the supply voltage reaching the different adjusted trip levels. Also, previous POR circuits 104-1, 104-2, and 104-3 shown in FIG. 1, which have an output signal that trips at one particular supplied voltage level, can cause increased calibration effort associated with calibrating the particular trip level for each of the separate POR circuits.

Figure 2A:
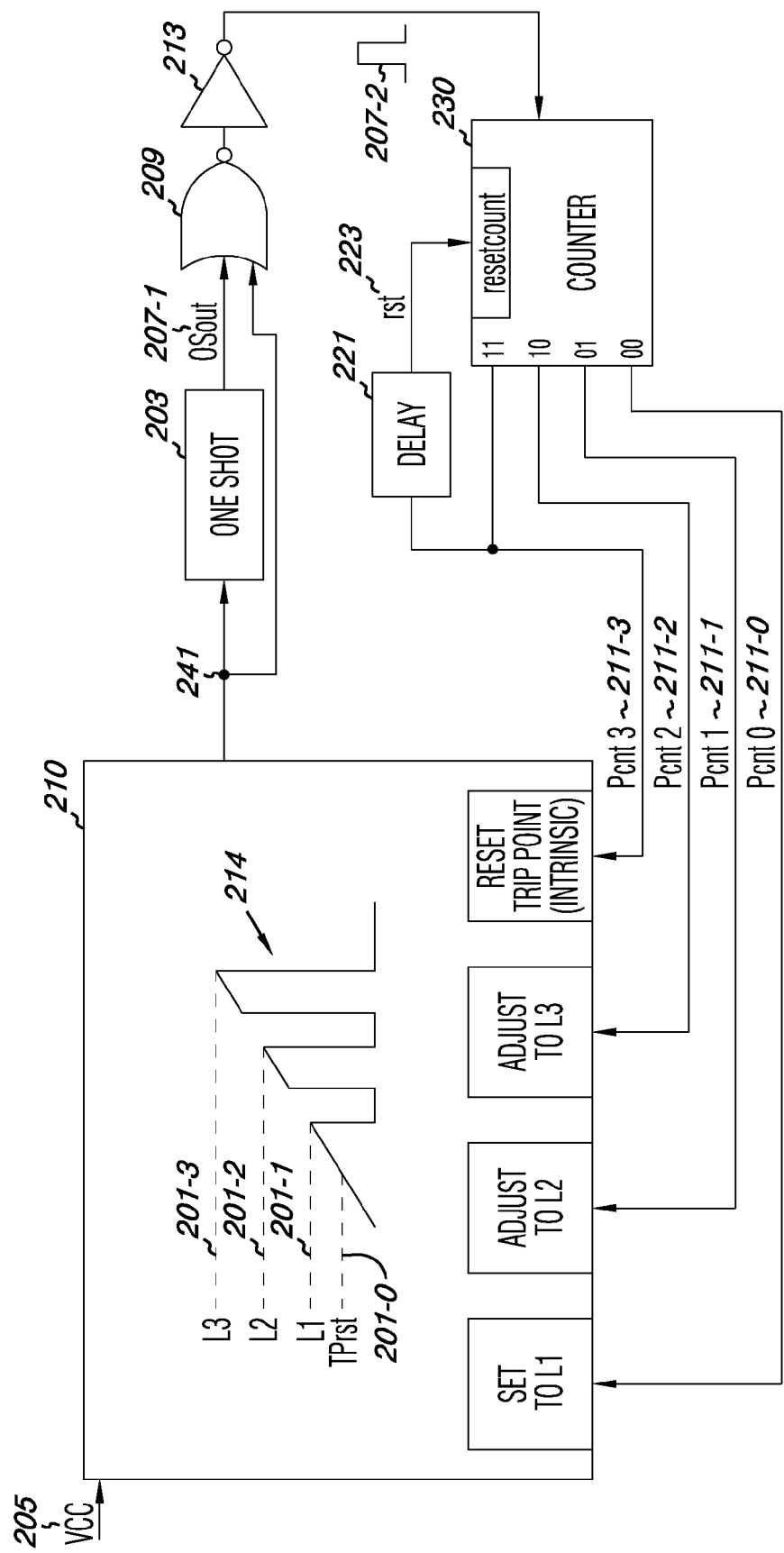
FIG. 2A illustrates a block diagram of a portion of a memory device having POR circuitry according to an embodiment of the present disclosure.
Figure 2B:
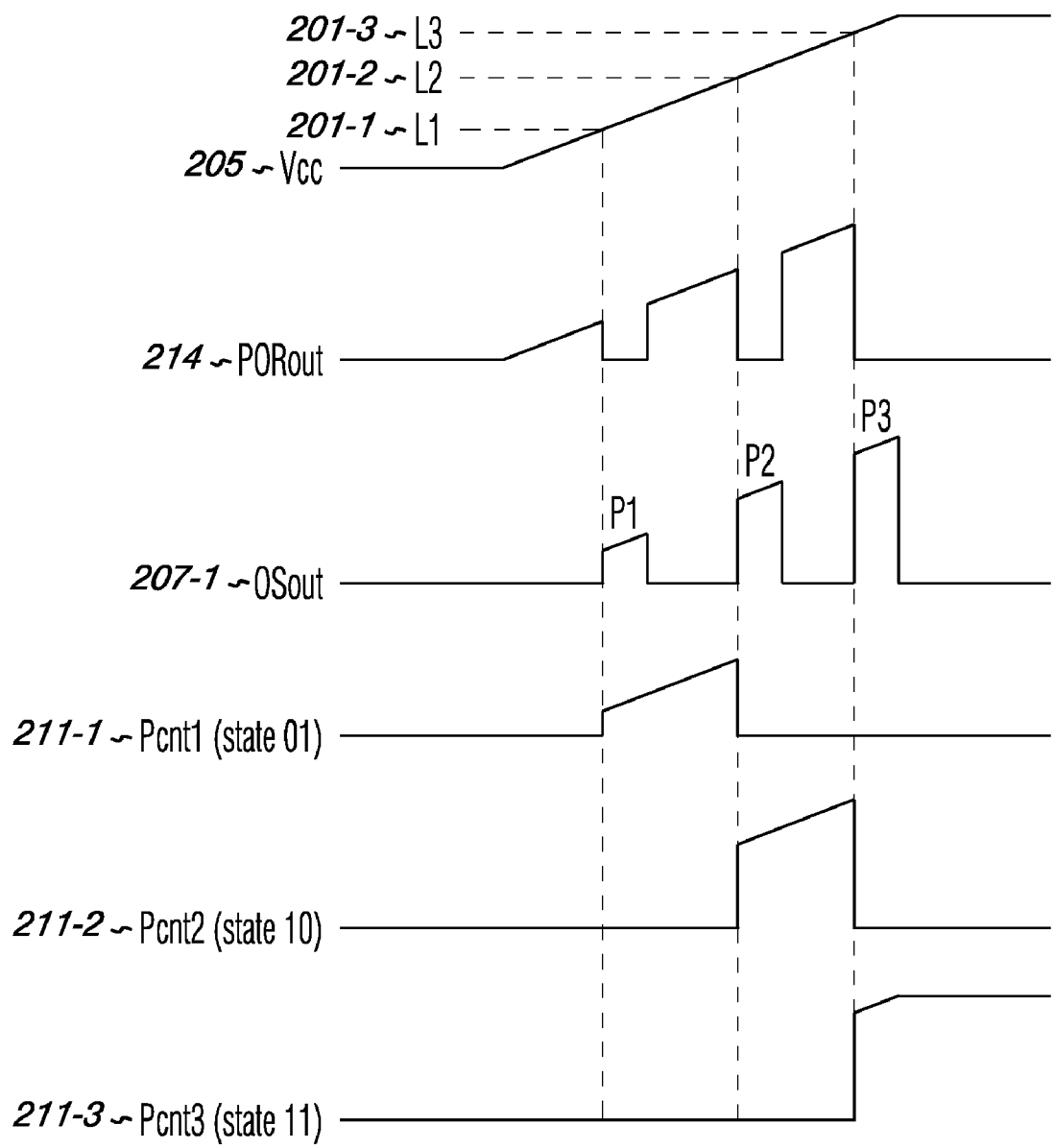
FIG. 2B illustrates example waveforms associated with operating the POR circuitry shown in the embodiment of FIG. 2A.

FIG. 2A illustrates a block diagram of a portion of a memory device having POR circuitry according to an embodiment of the present disclosure. FIG. 2B illustrates example waveforms associated with operating the POR circuitry shown in the embodiment of FIG. 2A.

In one or more embodiments, a POR circuit, e.g., 210, can detect when the power supply voltage provided thereto, e.g., VCC 205, reaches a number of different trip levels, e.g., trip levels 201-0 (TPrst), 201-1 (L1), 201-2 (L2), and 201-3 (L3). A trip level, or trip point, can refer to a detected voltage level at which an output signal, e.g., 214, of a POR circuit, e.g., 210, trips. That is, a detected voltage level of VCC 205 at which the POR output signal 214 (shown as "PORout" in FIG. 2B) goes from a high to a low level or a low to a high level. In the embodiment illustrated in FIG. 2A, the output signal PORout 214 of POR circuit 210 is presented at node 241 and can be used to perform various functions such as resetting, activating, and/or deactivating one or more internal circuits of the device.

In one or more embodiments, the different trip points, e.g., L1, L2, and L3, associated with PORout 214 can each be used to perform different functions. For instance, in some embodiments, a first function such as a reset function can be performed on a first internal circuit of a device, e.g., internal circuit 108-1 shown in FIG. 1, when the POR output signal 214 trips at trip level 201-1 (L1). In some embodiments, the first internal circuit can be one or more data latches or other logic circuitry that is reset in response to PORout 214 tripping at L1. In one or more embodiments, a second function such as an activation function can be performed on a second internal circuit of the device, e.g., internal circuit 108-2 shown in FIG. 1, when the output signal 214 trips at level 201-2 (L2). The second internal circuit can include one or more voltage reference circuits and/or charge pumps of the device to be activated when the supply voltage 205 of the device reaches voltage level 201-2. In one or more embodiments, a third function such as a program, erase, or read function can be performed on a third internal circuit of the device, e.g., internal circuit 108-3 shown in FIG. 1, when the output signal 214 trips at level 201-3 (L3). The third internal circuit can include an array of memory cells of the device, e.g., array 535 shown in FIG. 5, to be operated when the supply voltage 205 of the device reaches voltage level 201-3. Embodiments of the present disclosure are not limited to, a particular number of trip points associated with POR circuit 210, a particular function to be performed at the different trip points, or to particular internal circuitry of the device.

In one or more embodiments, a count of the number of times an output signal of a POR circuit, e.g., output signal 214 of POR circuit 210, trips in response to the detected reaching of one of the number of different trip levels, e.g., 201-0, 201-1, 201-2, and 201-3, can be maintained. In one or more embodiments, the POR circuitry includes a counting component, e.g., counter 230 shown in FIG. 2A, that can be used to maintain the count of the number of times the output signal, e.g., PORout 214, trips. In such embodiments, the state of the counting component 230 can be updated when the different trip levels are reached. In one or more embodiments and as described further below, the particular trip level, e.g., 201-0, 201-1, 201-2, and 201-3, to be detected by the POR circuit, e.g., 210, is adjusted based on the count maintained by the counting component 230, e.g., based on the state of the counter 230.

In one or more embodiments, an adjustment signal, e.g., 211-0, 211-1, 211-2, and 211-3, is provided to the POR circuit 210 based on the state of the counting component 230. In various embodiments, the adjustment signal is operable to adjust the trip level to be detected by the POR circuit 210 to particular ones of the number of different trip levels 201-0, 201-1, 201-2, and 201-3. As described further in connection with FIG. 3, in various embodiments, one or more of the adjustment signals 211-0, 211-1, 211-2, and 211-3 can change the voltage level at which the POR circuit 210 is currently set to trip by opening/closing one or more switches or by activating/deactivating one or more transistors associated with the POR circuit 210

In various embodiments, the particular adjustment signal 211-0, 211-1, 211-2, and 211-3 provided to the POR circuit 210 is based on the number of pulses received by the counting component 230 in response to the output signal 214 of the POR circuit 210 tripping at the number of different trip levels 201-0, 201-1, 201-2, and 201-3. One example of a counting component 230 is described in connection with FIGS. 4A and 4B.

In one or more embodiments, the particular trip level associated with the POR circuit, e.g., the particular supply voltage level to be detected, can be increased from an initial trip level voltage to an uppermost trip level voltage, while the supply voltage is ramping, e.g., during power up of the device. In some such embodiments, adjusting the particular trip level of the POR circuit, e.g., 210, includes increasing the particular trip level to a next subsequent trip level over a number of different trip levels until the uppermost trip level voltage has been reached. In one or more embodiments, the trip level of the POR circuit, e.g., 210, is adjusted to a reset trip level, e.g., 201-0 (TPrst), when the output signal 214 of the POR circuit 210 trips in response to a detected reaching of the uppermost trip level voltage, e.g., 201-3. In the embodiment illustrated in FIGS. 2A and 2B, the reset trip voltage level 201-0 (TPrst) is lesser in magnitude than the initial trip level 201-1 associated with the POR circuit 210.

In one or more embodiments, POR circuitry such as that illustrated in FIG. 2A, can include support circuitry that can receive the output signal, e.g., PORout 214, and can provide a pulse, e.g., 207-2, to a counting component, e.g., 230, at least partially in response to PORout 214 tripping. In the embodiment illustrated in FIG. 2A, the support circuitry includes a monostable multivibrator 203, e.g., one shot circuit 203, a NOR gate 209, and an inverter 213. The POR output signal PORout 214 is presented at node 241 and is provided to an input of the one shot circuit 203 and to an input of NOR gate 209. The output signal of the one shot 203, i.e., OSout 207-1, is also provided to an input of NOR gate 209. As the reader will appreciate, inverter 213 inverts the output of NOR gate 209 to provide a logic OR output.

As such, the output signal 207-1 of one shot 203 is considered to be ORed with the output signal 214 of POR circuit 210. In the embodiment illustrated in FIGS. 2A and 2B, the one shot 203 is a falling-edge one shot 203 which generates a pulse each time the PORout 214 trips. As such, the input of gate 209 that receives signal OSout 207-1 from one shot 203 is brought high when the input of gate 209 that receives signal PORout 214 is brought low when the POR circuit 210 trips. Since the logic output signal 207-1 is ORed with the output signal 214, a pulse 207-2 is provided from inverter 213 to counting component 230 each time the POR circuit 210 trips.

In the embodiment described in FIGS. 2A and 2B, the POR circuit 210 is initially configured to trip when the VCC 205 reaches level 201-1, e.g., a first trip level. That is, the POR circuit 210 is configured such that the output signal 214 will flip from a high to a low level, in this embodiment, when VCC 205 reaches level 201-1. In this embodiment, the signal 211-0 (Pent0) is used to set the trip point of POR circuit 210 to the trip voltage level 201-1 (L1). As described further in connection with FIGS. 3A and 3B, the signal 211-0 is based on the state of the counting component 230. In this example, the counter 230 is placed in a reset state (indicated by "00") when power is initially applied to the device, e.g., the counting component 230 can self-reset to state "00" when power is initially applied to the device. In one or more embodiments, counter 230 being in state "00" can indicate that the POR circuit 210 has not yet tripped in response to the applied ramping VCC 205, i.e., that VCC 205 has not yet reached the level at which POR circuit 210 is set to trip via control signal 211-0, e.g., level 201-1 (L1) in this example.

In the embodiment illustrated in FIGS. 2A and 2B, the one shot 203 generates a first pulse ("P1" in FIG. 2B) in response to the signal PORout 214 tripping when the ramping VCC 205 reaches voltage level 201-1, i.e., the voltage level at which the POR circuit 210 is currently configured to trip. The pulse counter 230 receives a first pulse 207-2 when the one shot 203 generates the first pulse P1, which increments the pulse count of counter 230, e.g., the state of counter 230 goes from "00" to "01." A first trip level adjustment signal 211-1 (Pent1) is provided to an input of POR circuit 210 at least partially in response to the first received pulse 207-2. The first trip level adjustment signal 211-1 is operable to adjust the trip level of the POR circuit 210 to a second voltage trip level, e.g., 201-2 (L2), of the number of different trip levels 201-0, 201-1, and 201-3. That is, the signal 211-1 changes the voltage level at which the POR circuit 210 is currently configured to trip, i.e., signal 211-1 sets the current trip point of the POR circuit 210 to L2, in this example.

In this example, and as shown in FIG. 2B, the one shot 203 generates a second pulse ("P2" in FIG. 2B) in response to the POR output signal 214 tripping when the ramping VCC 205 reaches voltage level 201-2, i.e., the voltage level at which the POR circuit 210 is currently configured to trip. The pulse counter 230 receives a second pulse 207-2 from the inverter 213 when the one shot 203 generates the second pulse P2, which increments the pulse count of counter 230, e.g., the state of counter 230 is updated from "01" to "10." A second trip level adjustment signal 211-2 (Pent2) is provided to an input of POR circuit 210 at least partially in response to the second received pulse 207-2. The second trip level adjustment signal 211-2 is operable to adjust the trip level of the POR circuit 210 to a third voltage trip level, e.g., 201-3 (L3), of the number of different trip levels 201-0, 201-1, 201-2, and 201-3. That is, the signal 211-2 changes the voltage level at which the POR circuit 210 is currently configured to trip, i.e., signal 211-2 sets the current trip point of the POR circuit 210 to L3, in this example.

In this example, the one shot 203 generates a third pulse ("P3" in FIG. 2B) in response to the POR output signal 214 tripping when the ramping VCC 205 reaches voltage level 201-3, i.e., the voltage level at which the POR circuit 210 is currently configured to trip. The pulse counter 230 receives a third pulse 207-2 from the inverter 213 when the one shot 203 generates the third pulse P3, which increments the pulse count of counter 230, e.g., the state of counter 230 is updated from "10" to "11." A third trip level adjustment signal 211-3 (Pent3) is provided to an input of POR circuit 210 at least partially in response to the third received pulse 207-2. In this embodiment, the third trip level adjustment signal 211-3 is operable to adjust the trip level of the POR circuit 210 to a reset voltage trip level, e.g., 201-0 (TPrst), of the number of different trip levels 201-0, 201-1, 201-2, and 201-3. That is, the signal 211-3 resets the current trip point of the POR circuit 210 to level 201-0, in this example. The reset voltage trip level 201-0 can correspond to an intrinsic trip level associated with the POR circuit 210. The intrinsic trip level can be about 1.2V. As discussed in connection with FIG. 3, resetting the trip point of the POR circuit 210 can prevent current leakage by removing a high current path associated with the POR circuit 210.

In one or more embodiments of the present disclosure, at least one trip level adjustment signal, e.g., 211-0, 211-1, 211-2, and 211-3, provided to the POR circuit 210 from the counting component 230 is provided to a reset input of the counting component. In the embodiment illustrated in FIG. 2A, the trip level adjustment signal 211-3 is provided to a delay circuit 221 which provides a reset signal rst 223 to a reset input (shown as "resetcount") of the counting component 230. The reset signal 223 can reset the state of the counting component 230 to state "00."

In one or more embodiments of the present disclosure, a number of different functions can be performed on various internal circuits of the device, during power on of the device, in response to the tripping of the output signal of the POR circuit at one or more of the number of different trip voltage levels, e.g., one or more of trip voltage levels 201-0, 201-1, 201-2, and 201-3 associated with POR circuit 210. A different function, e.g., a set/reset function or an activate/deactivate function, among others, can be performed on one or more internal circuits of the device in response to the signal PORout 214 tripping at each of the different trip levels, e.g., 201-0, 201-1, 201-2, and 201-3.

Figure 3:
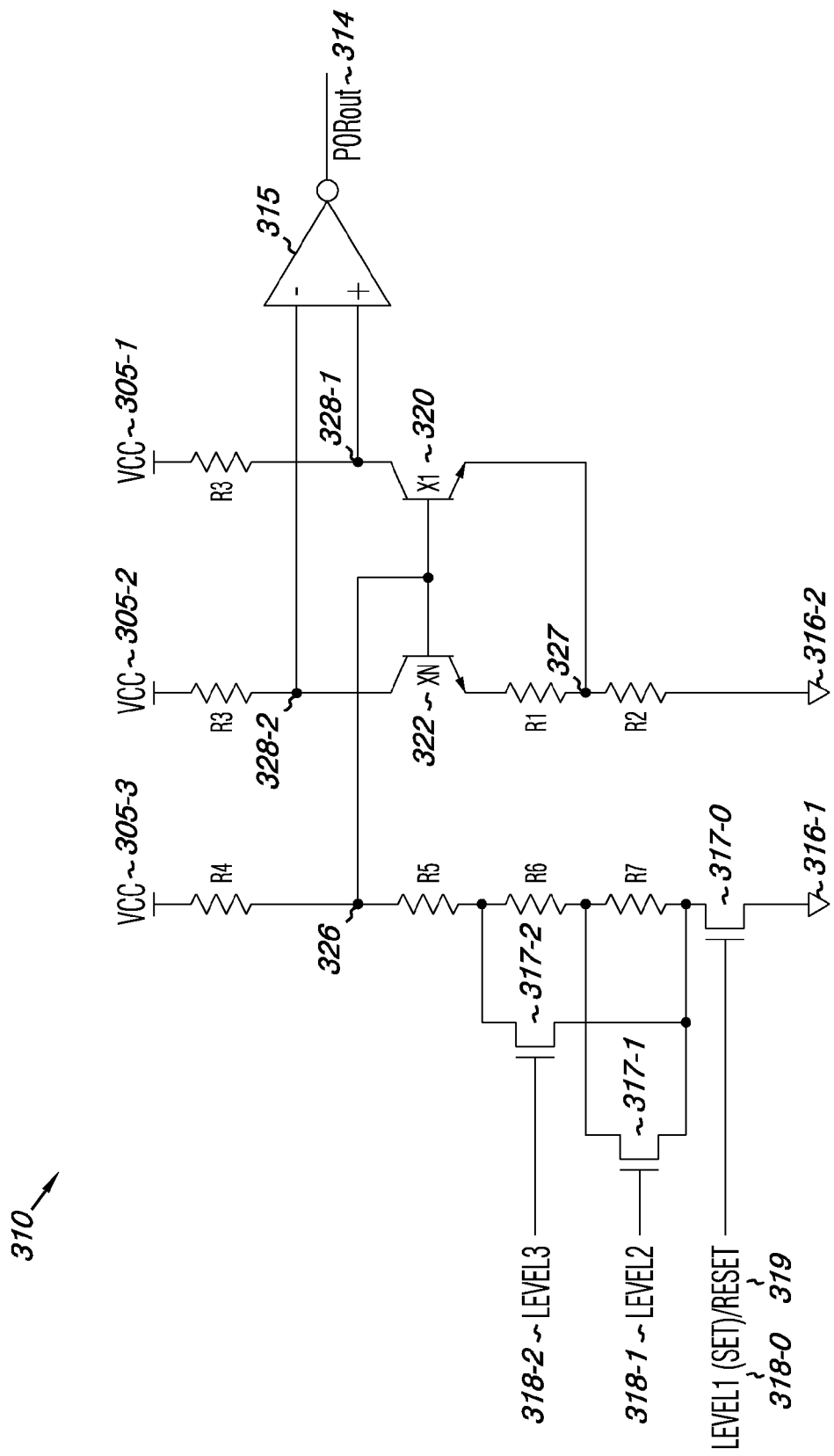
FIG. 3 illustrates an example of a POR circuit in accordance with an embodiment of the present disclosure.

FIG. 3 illustrates an example of a POR circuit in accordance with an embodiment of the present disclosure. The POR circuit 310 can be a POR circuit such as POR circuit 210 shown in FIG. 2A and can operate as described above in connection with FIGS. 2A and 2B. The POR circuit 310 can be a POR circuit of a memory device such, e.g., POR circuitry 515 shown in the memory device 525 of FIG. 5.

In the embodiment illustrated in FIG. 3, the trip point associated with POR circuit 310 is adjustable. For instance, the POR circuit 310 can be configured such the output signal PORout 314 of the POR circuit 310 trips when the supply voltage, e.g., VCC, reaches a number of different trip voltage levels, e.g., trip levels 201-0, 201-1, 201-2, and 201-3 shows in the embodiment of FIGS. 2A and 2B.

In this embodiment, the POR circuit 310 includes a comparator 315 that presents the output signal PORout 314. In one or more embodiments, the comparator 315 can include a folded cascode amplifier stage. A first input of comparator 315 is coupled to node 328-1 and a second input of comparator 315 is coupled to node 328-2. Node 328-1 is coupled to the collector of a first bipolar junction transistor (BJT) 320 and node 328-2 is coupled to the collector of a second BJT 322. In FIG. 3, the "XN" associated with transistor 322 and the "X1" associated with transistor 320 indicates that the transistor 322 has an associated multiplicity (X) that is "N" times the multiplicity of transistor 320, e.g., transistor 322 is "N" times larger in size than transistor 320. In this embodiment, the collector of transistor 322 and the collector of transistor 320 are each coupled to the power supply voltage VCC through a respective bias resistor R3. That is, the collector of transistor 320 is coupled to VCC node 305-1 through a resistor R3 and the collector of transistor 322 is coupled to VCC node 305-2 through another resistor R3. In the embodiment shown in FIG. 3, the emitter of BJT 320 is directly coupled to node 327 while the emitter of BJT 322 is coupled to node 327 through a resistor R1. Node 327 is coupled to a ground voltage node 316-2 through resistor R2.

In the embodiment illustrated in FIG. 3, the bases of the transistors 320 and 322 are connected together and coupled to node 326. The voltage level provided at node 326, i.e., the voltage provided at the bases of transistors 320 and 322, can be adjusted by activating/deactivating the various transistors 317-0, 317-1, and 317-2. The particular voltage applied at node 326 depends on various factors such as the value of VCC provided at VCC node 305-3, the resistance values of resistors R4, R5, R6, and R7, and which of the transistors 317-0, 317-1, and 317-2 are activated/deactivated, e.g., which transistors are turned on/off, among other factors. In this example, the transistors, 317-0, 317-1, and 317-2 are n-channel transistor, e.g., NMOS transistors, however, embodiments of the present disclosure may include PMOS transistors or other types of transistors.

As such, in one or more embodiments, the resistors R4, R5, R6, and R7 and transistors 317-0, 317-1, and 317-2 located between grounded node 316-1 and VCC node 305-3 form a voltage divider that can provide a number of different voltage levels at node 326 depending on which of the transistors 317-0, 317-1, and 317-2 are activated/deactivated. In various embodiments, adjusting the voltage level provided at node 326, i.e., the voltage level provided to the bases of transistors 320 and 322, adjusts the trip point associated with the POR circuit 310. That is, adjusting the voltage level provided at node 326 can reconfigure the current VCC level at which the output of the comparator 315, i.e., output signal PORout 314, is currently configured to trip, e.g., the VCC level at which the output of the comparator 315 flips from one rail to the other.

As an example, when the transistor 317-0 is deactivated, e.g., in a non-conducting or off state, the POR circuit 310 is configured to trip at an intrinsic trip point associated with the POR circuit 310. The intrinsic trip point can be referred to as a reset trip point or as a reset trip voltage level such as reset trip voltage level 201-0 (TPrst) shown in FIG. 2A. The intrinsic trip point can be a voltage level substantially equal to the bandgap reference voltage associated with silicon, e.g., about 1.2V. In one or more embodiments, the POR circuit 310 is considered to be in a reset state when the POR circuit is configured to trip at the intrinsic trip point, i.e., when transistor 317-0 is deactivated. In this example, a signal 319 (RESET) can be provided to transistor 317-0 to maintain the transistor 317-0 in a deactivated state, i.e., to provide a logic low signal to transistor 317-0.

In one or more embodiments, one or more functions can be performed at least partially in response to the output signal PORout 314 tripping at the intrinsic trip point. For instance, one or more internal circuits of the device, such as a number of data latches, can be set or reset in response to PORout 314 tripping at the intrinsic trip point.

In one or more embodiments, the transistor 317-0 can be activated, e.g., turned on, while transistors 317-1 and 317-2 are deactivated, e.g., turned off, in order to set the trip point of the POR circuit 310 at a particular trip voltage level, e.g., voltage level 201-1 (L1) shown in FIGS. 2A and 2B, of the number of different trip voltage levels. As one of ordinary skill in the art will appreciate, activating transistor 317-0 while transistors 317-1 and 317-2 are deactivated provides a particular voltage level at node 326 depending on the values of the chained resistors R4, R5, R6, and R7, as current flows between VCC node 305-3 and ground node 316-1 through each resistor in the chain.

The particular voltage level at node 326, i.e., the voltage level provided to the bases of BJTs 320 and 322, is proportional to the VCC level provided at VCC node 305-3 and configures the POR circuit 310 such that the output signal PORout 314 trips when the VCC reaches a particular level. In one or more embodiments, activating transistor 317-0 and deactivating transistors 317-1 and 317-2 configures the POR circuit 310 such that the POR circuit 310 trip point is at a particular voltage level within a voltage range of about 1.25V to about 1.3V, i.e., the POR circuit 310 is configured such that output signal PORout 314 trips when the VCC level reaches the particular voltage level within the range.

In one or more embodiments, the trip voltage level associated with POR circuit 310 when transistor 317-0 is activated and transistors 317-1 and 317-2 are deactivated is the first VCC voltage level at which the POR circuit 310 is configured to trip when VCC is initially applied to the POR circuit 310. In such embodiment, signal 318-0 (LEVEL1) can be provided to transistor 317-0 when power is initially applied to the POR circuit 310, e.g., during power on of the device. As such, in one or more embodiments, signal 318-0 can be provided to transistor 317-0 to activate the transistor 317-0 each time the supply voltage VCC is ramping, e.g., each time the device is turned on.

In one or more embodiments, the transistor 317-0 remains activated, during power on of the device, until signal 319 (RESET) deactivates transistor 317-0. As such, in one or more embodiments, the transistor 317-0 remains activated, during power on of the device, until the POR circuit 310 has tripped at each of a number of different trip voltage levels. Deactivating transistor 317-0 after the POR circuit 310 has tripped in response to the ramping VCC reaching a voltage level corresponding to an uppermost trip voltage level associated with the POR circuit 310, e.g., uppermost trip voltage level 201-3 (L3) shown in FIGS. 2A and 2B, can prevent current leakage from VCC node 305-3 through resistors R4, R5, R6, and R7.

In one or more embodiments, the transistor 317-1 can be activated, while transistor 317-0 is activated and transistor 317-2 is deactivated, in order to set the trip point of the POR circuit 310 at another particular trip voltage level, e.g., trip voltage level 201-2 shown in FIGS. 2A and 2B, of the number of different trip voltage levels. In this embodiment, activating transistor 317-1 removes resistor R7 from the chain of resistors R4, R5, R6, and R7, which adjusts the voltage level provided at node 326. As such, activating transistor 317-1 while transistors 317-0 is activated and transistor 317-2 is deactivated provides a particular voltage level at node 326 depending on the values of resistors R4, R5, and R6. The particular voltage level at node 326 configures the POR circuit 310 such that the output signal PORout 314 trips when the VCC reaches a particular level. In one or more embodiments, activating transistor 317-1 while transistors 317-0 is activated and transistor 317-2 is deactivated configures the POR circuit 310 such that the POR circuit 310 trip point is at a particular voltage level within a voltage range of about 1.3V to about 1.4V, i.e., the POR circuit 310 is configured such that output signal PORout 314 trips when the VCC level reaches the particular voltage level within the range.

In one or more embodiments, the trip voltage level associated with POR circuit 310 when transistor 317-1 is activated, transistor 317-0 is activated, and transistor 317-2 is deactivated is the second VCC voltage level of a number of trip voltage levels at which the POR circuit 310 is configured to trip when VCC is applied to the POR circuit 310. In such embodiments, the second VCC voltage level can be greater in magnitude than the first VCC voltage level at which the POR circuit 310 is configured trip when VCC is applied to the POR circuit 310. In such embodiments, signal 318-1 (LEVEL2) can be provided to transistor 317-1 in order to adjust the trip point of POR circuit 310 from the first trip voltage level to the second trip voltage level in response to the output signal PORout 314 tripping at the first trip voltage level during power on of the device. As such, in one or more embodiments, signal 318-1 can be provided to transistor 317-1 to activate the transistor 317-1 each time the output signal PORout 314 trips in response to the ramping supply voltage VCC reaching the first trip voltage level during power on of the device. That is, signal 318-1 can be provided to activate transistor 317-1 in response to the PORout 314 tripping at the particular trip voltage level at which the POR circuit 310 is configured to trip when transistor 317-0 is activated and transistors 317-1 and 317-2 are deactivated.

In one or more embodiments, the transistor 317-2 can be activated, while transistor 317-0 is activated and transistor 317-1 is deactivated, in order to set the trip point of the POR circuit 310 at another particular trip voltage level, e.g., trip voltage level 201-3 (L3) shown in FIGS. 2A and 2B, of the number of different trip voltage levels. In this embodiment, activating transistor 317-2 removes resistors R6 and R7 from the chain of resistors R4, R5, R6, and R7, which adjusts the voltage level provided at node 326. As such, activating transistor 317-2 while transistors 317-0 is activated and transistor 317-1 is deactivated provides a particular voltage level at node 326 depending on the values of resistors R4 and R5. In one or more embodiments, activating transistor 317-2 while transistors 317-0 is activated and transistor 317-1 is deactivated configures the POR circuit 310 such that the POR circuit 310 trip point is at a particular voltage level within a voltage range of about 1.4V to about 1.6V, i.e., the POR circuit 310 is configured such that output signal PORout 314 trips when the VCC level reaches the particular voltage level within the range.

In one or more embodiments, the trip voltage level associated with POR circuit 310 when transistor 317-2 is activated, transistor 317-0 is activated, and transistor 317-1 is deactivated is the third VCC voltage level of a number of trip voltage levels at which the POR circuit 310 is configured to trip when VCC is applied to the POR circuit 310. In such embodiments, the third VCC voltage level can be greater in magnitude than the first and second VCC voltage levels at which the POR circuit 310 is configured trip when VCC is applied to the POR circuit 310. In such embodiments, signal 318-2 (LEVEL3) can be provided to transistor 317-2 in order to adjust the trip point of POR circuit 310 from the second trip voltage level to the third trip voltage level in response to the output signal PORout 314 tripping at the second trip voltage level during power on of the device. As such, in one or more embodiments, signal 318-2 can be provided to transistor 317-2 to activate the transistor 317-2 each time the output signal PORout 314 trips in response to the ramping supply voltage VCC reaching the second trip voltage level during power on of the device. That is, signal 318-2 can be provided to activate transistor 317-2 in response to the PORout 314 tripping at the particular trip voltage level at which the POR circuit 310 is configured to trip when transistor 317-1 is activated, transistor 317-0 is activated, and transistor 317-2 is deactivated.

As an example, in one or more embodiments, signal 318-0 (LEVEL1) activates transistor 317-0 such that POR circuit 310 is configured to trip at a trip voltage level such as 201-1 (L1) shown in FIGS. 2A and 2B. In such embodiments, signal 318-1 (LEVEL 2) activates transistor 317-1 such that POR circuit 310 is configured to trip at trip voltage level such as 201-2 (L2), and signal 318-2 activates transistor 317-2 such that POR circuit 310 is configured to trip at a trip voltage level such as 201-3 (L3) shown in FIGS. 2A and 2B. In this example, the signal 318-1 can be signal 211-1 (Pent1) shown in FIG. 2B and the signal 318-2 can be signal 211-2 (Pent2) shown in FIG. 2B.

As the reader will appreciate, the signals 318-1, 318-2, 318-3, and 319 illustrated in the embodiment of FIG. 3 can be provided from a counting component of the device, e.g., from a counting component such as counting component 230 described in FIG. 2B or counting component 430 described in connection with FIGS. 4A and 4B.

Physically configuring a POR circuit in a manner such as POR circuit 310 shown in FIG. 3 can provide a number of stable trip points over a broad range of device operating temperatures. For example, in one or more embodiments, the trip voltage level corresponding to each of the number of different trip points associated with POR circuit 310 varies by not more than 50 mV over expected process and temperature (PT) variations of the device.

In the embodiment illustrated in FIG. 3, the trip point associated with POR circuit 310 can be adjusted over a number of different VCC trip voltage levels, i.e., the POR circuit 314 can be configured such the output signal 314 of the POR circuit 314 trips in response to the applied VCC voltage reaching a number of different levels. As such, the POR circuit 310 can be used to provide multiple POR signals via the multiple trip points associated with output signal PORout 314. As described above in connection with the previous approach shown in FIG. 1, multiple POR circuits, e.g., 104-1, 104-2, and 104-3, were used to provide three POR signals, e.g., POR1, POR2, and POR3, respectively, in order to perform functions on respective internal circuits, e.g., 108-1, 108-2, and 108-3. In such previous approaches, each of the POR circuits 104-1, 104-2, and 104-3 would have to include an amplifier or comparator.

In contrast, in one or more embodiments of the present disclosure, a single POR circuit having multiple trip points is provided which affords benefits such as a reduction in the physical area on devices or systems that include internal circuits that function properly at various different VCC levels. For instance, in the embodiment illustrated in FIG. 3, a single comparator 315 presents the POR output signal PORout 314, which can be used to perform functions on a number of internal circuits of the device or system at one or more of the number of different trip points associated with POR circuit 310.

The POR circuit 310 illustrated in the embodiment shown in FIG. 3 can be configured to trip at four different trip voltage levels depending on which of the transistors 317-0, 317-2, and 317-2 are activated or deactivated. However, embodiments are not so limited. For instance, as one of ordinary skill in the art will appreciate upon reading this disclosure, the various POR circuits in accordance with the present disclosure can be configured to trip at more or fewer than four different trip levels. For instance, more or fewer resistors, e.g., R4, R5, R6, and R7, can included in the resistor chain between VCC node 305-3 and ground node 316-1.

Figures 4A, 4B:
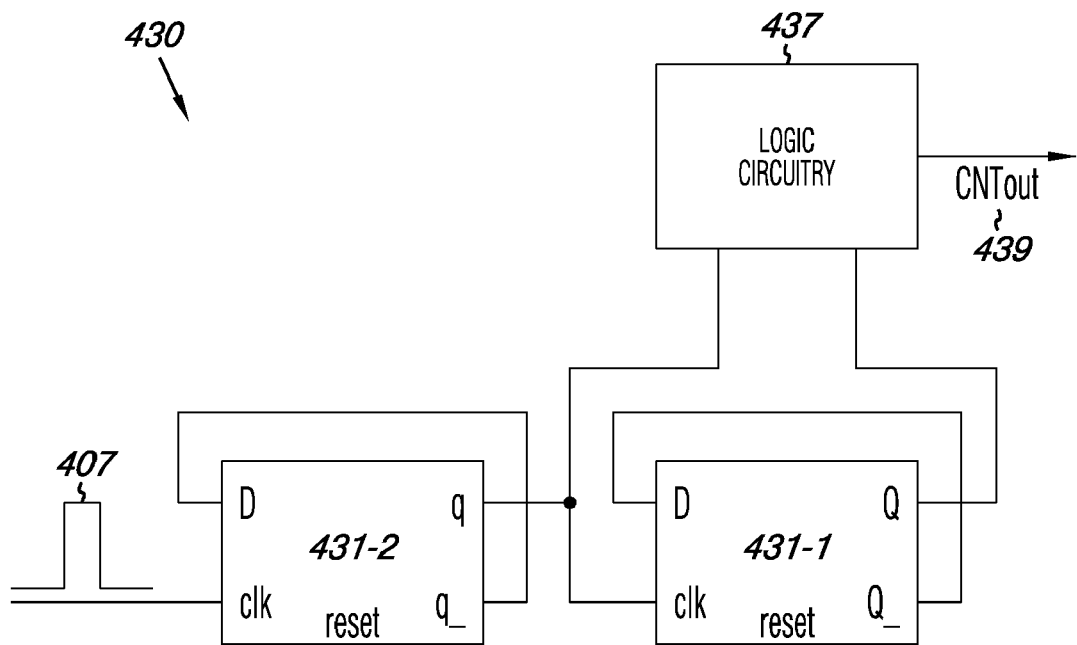
FIG. 4A illustrates an example of a counting component that can be used with POR circuit embodiments of the present disclosure.
FIG. 4B is a table illustrating an example of states of the counting component embodiment shown in FIG. 4A along with associated output signals and pulse counts.

FIG. 4A illustrates an example of a counting component 430 that can be used with POR circuit embodiments of the present disclosure. The counting component 430 can be a counting component such as counting component 230 described in connection with FIGS. 2A and 2B. FIG. 4B is a table 445 illustrating an example of states of the counting component 430 shown in FIG. 4A along with associated output signals and pulse counts.

In the embodiment of FIG. 4A, the counting component 430 includes a pulse counter comprising a pair of flip flops 431-1 and 431-2 having their respective data inputs (D) coupled to their respective inverted outputs (Q_ and q_). The output (q) of the flip flop 431-2 is coupled to the clock input (clk) of the flip flop 431-1. In the embodiment illustrated in FIG. 4A, the state of the outputs (Q and q) of the flip flops 431-1 and 431-2, i.e., the state of the pulse counter, is updated, e.g., incremented, when a pulse, e.g., pulse 407, is provided to the clock input (clk) of the flip flop 431-2.

In one or more embodiments, and as illustrated in table 445 of FIG. 4B, the binary state of the outputs (Q and q) of the flip flops 431-1 and 431-2, e.g., the counter state, can correspond with the number of pulses 407 received by the flip flop 431-2. For example when the pulse count is zero, i.e., no pulses 407 have been received by the clock input (clk) of flip flop 431-2, the state (Q) of flip flop 431-1 is a logic "0" and the state (q) of flip flop 431-2 is a logic "0" such that the counter state is "00." In the embodiment illustrated in FIG. 4A and 4B, the output (q) represents the least significant bit and the output (Q) represents the most significant bit. As such, when the pulse count is one, i.e., after one pulse 407 has been received by the clock input (clk) of flip flop 431-2, the counter state is "01." When the pulse count is two, i.e., after two pulses have been received by the clock input (clk) of flip flop 431-2, the counter state is "10." When the pulse count is three, i.e., after three pulses have been received by the clock input (clk) of flip flop 431-2, the counter state is "11."

Embodiments of the present disclosure are not limited to the example shown in FIGS. 4A and 4B. For instance, one of ordinary skill in the art will appreciate that the additional flip flops can be added to increase the number of states represented by the counting component. Also, embodiments are not limited to a particular type of counter. For instance, the counting component 430 can include an asynchronous counter, a synchronous counter or an up-down counter, among various other types of counting components.

As shown in FIG. 4A, the output (Q) of flip flop 431-1 and the output (q) of flip flop 431-2 are coupled to logic circuitry 437. The logic circuitry 437 can include logic gates to provide an output signal CNTout 439 based on the state of the pulse counter, i.e., based on the output state (Q) of flip flop 431-1 and the output state (q) of flip flop 431-2. As described in connection with FIGS. 2A and 2B, in one or more embodiments, the output signal, e.g., 439, of the counting component, e.g, 430, can be provided to a POR circuit of an electronic device or system, e.g., POR circuit 210 shown in FIG. 2A or POR circuit 310 shown in FIG. 3. In such embodiments, the output signal, e.g., 439, is operable to adjust the trip voltage level associated with the POR circuit.

In the embodiment illustrated in FIGS. 4A and 4B, and as shown in table 445, the counter component 430 provides a different output signal 439 depending on the state of the counter, i.e., depending on the current pulse count. For instance, when the counter state is "00," the counter outputs signal 411-0 (Pent0). When the counter state is "01," the counter outputs signal 411-1 (Pent1). When the counter state is "10," the counter outputs signal 411-2 (Pent2). When the counter state is "11," the counter outputs signal 411-3 (Pent3). In one or more embodiments, one or more of the signals 411-0, 411-1, 411-2, and 411-3 can be provided to an input of a POR circuit in accordance with an embodiment of the present disclosure. In one or more of such embodiments, each of the signals 411-0, 411-1, 411-2, and 411-3 can be operable to adjust the trip point associated with the POR circuit to a different trip voltage level of a number of trip voltage levels.

Figure 5:
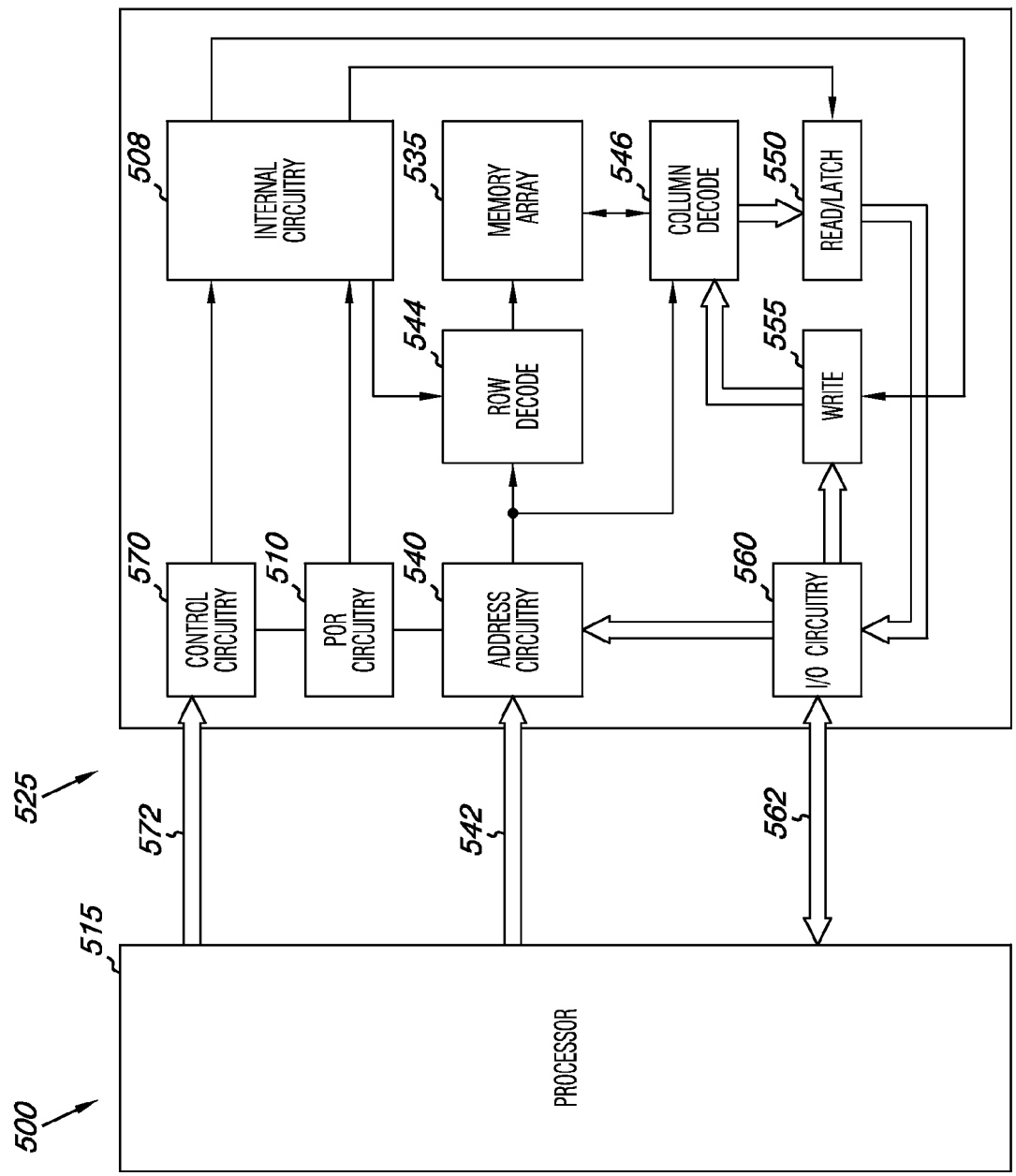
FIG. 5 is a functional block diagram of an electronic memory system having at least one memory device in accordance with an embodiment of the present disclosure.

FIG. 5 is a functional block diagram of an electronic memory system 500 having at least one memory device 525 in accordance with an embodiment of the present disclosure. Memory system 500 includes a processor 515 coupled to a memory device 525 that includes a memory array 535 of memory cells. The memory device 525 can include an array 535 of non-volatile memory cells, e.g., floating gate memory cells, which can be arranged in a NAND architecture or a NOR architecture.

The memory system 500 can include separate integrated circuits or both the processor 515 and the memory device 525 can be on the same integrated circuit. The processor 515 can be a microprocessor or some other type of controlling circuitry such as an application-specific integrated circuit (ASIC).

The embodiment of FIG. 5 includes address circuitry 540 to latch address signals provided over I/O connections 562 through I/O circuitry 560. Address signals are received and decoded by a row decoder 544 and a column decoder 546 to access the memory array 535. In light of the present disclosure, it will be appreciated by those skilled in the art that the number of address input connections depends on the density and architecture of the memory array 535 and that the number of addresses increases with both increased numbers of memory cells and increased numbers of memory blocks and arrays.

The memory device 525 reads data in the memory array 535 by sensing voltage and/or current changes in the memory array columns using sense/buffer circuitry that in this embodiment can be read/latch circuitry 550. The read/latch circuitry 550 can read and latch a page or row of data from the memory array 535. I/O circuitry 560 is included for bi-directional data communication over the I/O connections 562 with the processor 515. Write circuitry 555 is included to write data to the memory array 535.

Control circuitry 570 decodes signals provided by control connections 572 from the processor 515. These signals can include chip signals, write enable signals, and address latch signals that are used to control the operations on the memory array 535, including data read, data write, and data erase operations. In various embodiments, the control circuitry 570 is responsible for executing instructions from the processor 515 to perform the operating embodiments of the present disclosure. The control circuitry 570 can be a state machine, a sequencer, or some other type of controller. It will be appreciated by those skilled in the art that additional circuitry and control signals can be provided, and that the memory device detail of FIG. 5 has been reduced to facilitate ease of illustration.

In the embodiment illustrated in FIG. 5, the memory device 525 includes power on reset (POR) circuitry 510. The POR circuitry 510 can include a POR circuit such as POR circuit 210 shown in FIG. 2A or POR circuit 310 shown in FIG. 3. The POR circuitry 510 is coupled to control circuitry 570, address circuitry 540, and internal circuitry 508. The internal circuitry 508 can include various internal circuits of memory device 525 including, but not limited to, fuse circuits, reference voltage circuits, and/or charge pump circuits, among other internal circuits that can be used to perform operations on the memory array 535 of device 525.

The POR circuitry 510 can be used in various embodiments in a memory device and in a processing system including processor 515, to prevent various internal circuits, e.g., 508, within the memory device of system from operating until the power supply voltage, e.g., VCC, reaches a voltage level adequate for proper operation of the particular internal circuit. As described herein above, in various embodiments of the present disclosure, the POR circuitry 510 includes a POR circuit having an output signal that can be configured to trip at multiple VCC trip voltage levels. In some such embodiments, each VCC trip voltage level associated with the POR circuit can correspond to a particular VCC voltage level adequate to insure proper functioning of one or more internal circuit of the device.

Figure 6:
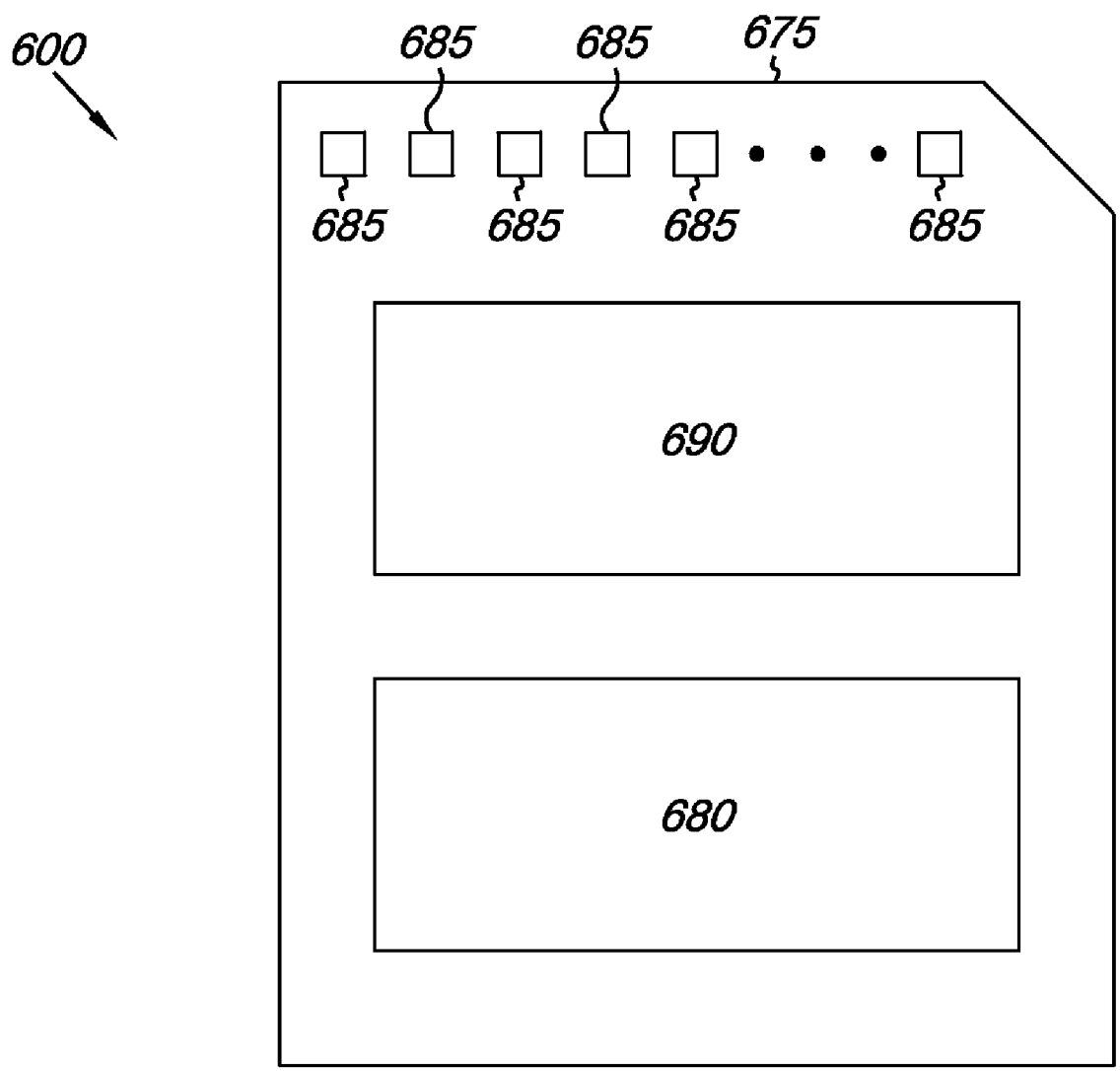
FIG. 6 is a functional block diagram of a memory module having at least one memory device in accordance with an embodiment of the present disclosure.

FIG. 6 is a functional block diagram of a memory module 600 having at least one memory device having a POR circuit in accordance with an embodiment of the present disclosure. Memory module 600 is illustrated as a memory card, although the concepts discussed with reference to memory module 600 are applicable to other types of removable or portable memory (e.g., USB flash drives) and are intended to be within the scope of "memory module" as used herein. In addition, although one example form factor is depicted in FIG. 6, these concepts are applicable to other form factors as well.

In some embodiments, memory module 600 will include a housing 675 (as depicted) to enclose one or more memory devices 680, though such a housing is not essential to all devices or device applications. At least one memory device 680 includes an array of non-volatile memory cells and fuse circuitry that can be operated according to embodiments described herein. Where present, the housing 605 includes one or more contacts 685 for communication with a host device. Examples of host devices include digital cameras, digital recording and playback devices, PDAs, personal computers, memory card readers, interface hubs and the like. For some embodiments, the contacts 685 are in the form of a standardized interface. For example, with a USB flash drive, the contacts 685 might be in the form of a USB Type-A male connector. For some embodiments, the contacts 685 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 685 provide an interface for passing control, address and/or data signals between the memory module 600 and a host having compatible receptors for the contacts 685.

The memory module 600 may optionally include additional circuitry 690, which may be one or more integrated circuits and/or discrete components. For some embodiments, the additional circuitry 690 may include control circuitry, such as a memory controller, for controlling access across multiple memory devices 680 and/or for providing a translation layer between an external host and a memory device 680. For example, there may not be a one-to-one correspondence between the number of contacts 685 and a number of 680 connections to the one or more memory devices 680. Thus, a memory controller could selectively couple an I/O connection (not shown in FIG. 6) of a memory device 680 to receive the appropriate signal at the appropriate I/O connection at the appropriate time or to provide the appropriate signal at the appropriate contact 685 at the appropriate time. Similarly, the communication protocol between a host and the memory module 600 may be different than what is required for access of a memory device 680. A memory controller could then translate the command sequences received from a host into the appropriate command sequences to achieve the desired access to the memory device 680. Such translation may further include changes in signal voltage levels in addition to command sequences.

The additional circuitry 690 may further include functionality unrelated to control of a memory device 680 such as logic functions as might be performed by an ASIC. Also, the additional circuitry 690 may include circuitry to restrict read or write access to the memory module 600, such as password protection, biometrics or the like. The additional circuitry 690 may include circuitry to indicate a status of the memory module 600. For example, the additional circuitry 690 may include functionality to determine whether power is being supplied to the memory module 600 and whether the memory module 600 is currently being accessed, and to display an indication of its status, such as a solid light while powered and a flashing light while being accessed. The additional circuitry 690 may further include passive devices, such as decoupling capacitors to help regulate power requirements within the memory module 600.

CONCLUSION

Methods, devices, modules, and systems for operating POR circuitry have been shown. One or more method embodiments includes providing a voltage to a POR circuit of the system, detecting when the voltage reaches a number of different trip levels, maintaining a count of the number of times an output signal of the POR circuit trips in response to a detected reaching of one of the number of different trip levels, and adjusting the trip level to be detected based at least partially on the count.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of operating an electronic system, the method comprising:
providing a voltage to a power on reset (POR) circuit of the system;
detecting when the voltage reaches a number of different trip levels;
maintaining a count of the number of times an output signal of the POR circuit trips in response to a detected reaching of one of the number of different trip levels; and
adjusting the trip level to be detected based at least partially on the count.

2. The method of claim 1, wherein the method includes performing a reset function on a first internal circuit of the system at least partially in response to a first tripping of the output signal.

3. The method of claim 2, wherein the method includes activating a second internal circuit of the system at least partially in response to a second tripping of the output signal.

4. The method of claim 1, wherein adjusting the trip level to be detected based at least partially on the count includes increasing the trip level from an initial trip level voltage to an uppermost trip level voltage.

5. The method of claim 4, wherein the method includes adjusting the trip level to a reset trip level when the output signal of the POR circuit trips in response to a detected reaching of the uppermost trip level voltage.

6. The method of claim 5, wherein the count is maintained with a pulse counter, and wherein the method includes resetting the pulse counter when the output signal of the POR circuit trips in response to the detected reaching of the uppermost trip level voltage.

7. The method of claim 4, wherein adjusting the trip level to the reset trip level includes adjusting the reset trip level to a voltage level lesser in magnitude than the initial trip level voltage.

8. The method of claim 1, wherein detecting when the voltage reaches the number of different trip levels includes using a voltage detection component that includes only one comparator having an output that presents the POR output signal.

9. A method of operating an electronic system, the method comprising:
providing a voltage to a power on reset (POR) circuit that presents an output signal set to trip at a first detected voltage trip level of a number of different voltage trip levels;
performing a first function at least partially in response to the output signal tripping at the first detected voltage trip level;
updating a state of a counting component, the state associated with a number of times the output signal has tripped;
adjusting the voltage trip level to a second trip level at least partially based on the updated state; and
performing a second function at least partially in response to the output signal tripping at the second trip level.

10. The method of claim 9, wherein the method includes:
updating the state at least partially in response to the output signal tripping at the second trip level;
adjusting the voltage trip level to at least a third trip level at least partially based on the updating of the state at least partially in response to the output signal tripping at the second trip level; and
performing at least a third function at least partially in response to the output signal tripping at the at least the third trip level.

11. The method of claim 9, wherein the method includes detecting the output signal tripping while the voltage is ramping during power on of the electronic system.

12. The method of claim 9, wherein the method includes providing the output signal to an input of a one-shot circuit to generate a pulse in response to the output signal tripping at the number of different voltage trip levels.

13. The method of claim 9, wherein performing the first function includes resetting at least one latch of an internal circuit of the system.

14. The method of claim 9, wherein the method includes presenting the output signal of the POR circuit at an output of a comparator, a first input of the comparator connected to a collector of a first bipolar junction transistor (BJT) and a second input of the comparator connected to a collector of at least a second BJT.

15. The method of claim 14, wherein the method includes providing the voltage to a node that is connected to a base of the first BJT and to a base of the at least the second BJT.

16. An electronic system including power on reset (POR) circuitry, the circuitry comprising:
a POR circuit to detect when a voltage provided to the POR circuit reaches a number of different trip levels; and
a counting component to:
receive a pulse in response to an output signal of the POR circuit tripping at the number of different trip levels; and
provide an adjustment signal to the POR circuit in response to the received pulse, the adjustment signal associated with the number of pulses received in response to the output signal of the POR circuit tripping at the number of different trip levels.

17. The circuitry of claim 16, wherein the adjustment signal is operable to adjust the trip level to be detected by the POR circuit to particular ones of the number of different trip levels.

18. The circuitry of claim 16, wherein the output signal is provided to an input of a one shot circuit.

19. The circuitry of claim 18, wherein an output of the one shot circuit is coupled to a first input of a NOR gate and a second input of the NOR gate receives the output signal of the POR circuit.

20. The circuitry of claim 19, wherein an output of the NOR gate is coupled to inverter, an output of the inverter provides the pulse received by the counting component at least partially in response to the output signal of the POR circuit tripping at the number of different trip levels.

21. The circuitry of claim 16, wherein the POR circuit includes:
a first bipolar junction transistor (BJT) having a collector coupled to a first input of a comparator; and
at least a second BJT having a collector coupled to a second input of the comparator.

22. The circuitry of claim 21, wherein a base of the first BJT and a base of the at least the second BJT are coupled together.

23. The circuitry of claim 22, wherein the base is coupled to a voltage divider.

24. An electronic system, comprising:
an array of memory cells;
control circuitry and at least one internal circuit associated with operating the array; and
power on reset (POR) circuitry configured to reset the at least one internal circuit while a voltage of the system is ramping, the POR circuitry including:

a POR circuit receiving the ramping voltage and having an output signal set to trip at a first voltage trip level of a number of different trip levels;

support circuitry that receives the output signal of the POR circuit and provides a first pulse to a pulse counter at least partially in response to the output signal tripping at the first voltage trip level; and a counting component that provides a first trip level adjustment signal to a first input of the POR circuit at least partially in response to the first pulse, the first trip level adjustment signal operable to adjust the trip level of the POR circuit to a second voltage trip level of the number of different trip levels.

25. The system of claim 24, wherein:

the support circuitry provides a second pulse to the counting component at least partially in response to the output signal tripping at the second voltage trip level; and the counting component provides a second trip level adjustment signal to a second input of the POR circuit at least partially in response to the second pulse, the second trip level adjustment signal operable to adjust the trip level of the POR circuit to a third voltage trip level of the number of different trip levels.

* * * * *